(12) United States Patent
Iwakura et al.

(10) Patent No.: US 9,582,632 B2
(45) Date of Patent: Feb. 28, 2017

(54) WIRING TOPOLOGY METHOD AND INFORMATION PROCESSING DEVICE

(71) Applicant: FUJITSU LIMITED, Kawasaki-shi, Kanagawa (JP)

(72) Inventors: Yoshiyuki Iwakura, Hadano (JP); Hidenobu Shiihara, Kawasaki (JP); Tsunaki Iwasaki, Sagamihara (JP)

(73) Assignee: FUJITSU LIMITED, Kawasaki (JP)

(*) Notice: Subject to any disclaimer, the term of this patent is extended or adjusted under 35 U.S.C. 154(b) by 0 days.

(21) Appl. No.: 14/920,962

(22) Filed: Oct. 23, 2015

(65) Prior Publication Data

US 2016/0147930 A1    May 26, 2016

(30) Foreign Application Priority Data

Nov. 25, 2014   (JP) .................................. 2014-237725

(51) Int. Cl.
  *G06F 17/50*   (2006.01)
(52) U.S. Cl.
  CPC ...... *G06F 17/5077* (2013.01); *G06F 17/5072* (2013.01)
(58) Field of Classification Search
  CPC .................................................. G06F 17/5077
  USPC ........................................................ 716/137
  See application file for complete search history.

(56) References Cited

U.S. PATENT DOCUMENTS

| | | | | |
|---|---|---|---|---|
| 2009/0249264 | A1* | 10/2009 | Uriu | G06F 17/5018 716/103 |
| 2009/0254873 | A1* | 10/2009 | Uriu | G06F 17/5036 716/111 |
| 2010/0325594 | A1* | 12/2010 | Sakata | G06F 17/5036 716/106 |
| 2011/0214099 | A1* | 9/2011 | Chen | G06F 17/5077 716/112 |
| 2012/0331434 | A1* | 12/2012 | Huang | G06F 17/5081 716/111 |

FOREIGN PATENT DOCUMENTS

| | | |
|---|---|---|
| JP | 9-325973 | 12/1997 |
| JP | 2000-123060 | 4/2000 |
| JP | 2010-39598 | 2/2010 |

* cited by examiner

*Primary Examiner* — Suresh Memula
(74) *Attorney, Agent, or Firm* — Fujitsu Patent Center

(57) ABSTRACT

A wiring topology display method, includes: obtaining layout information indicating positions of components and wiring coupling the components; dividing first wiring into first pieces of partial wiring, and generating partial wiring information indicating the first pieces of partial wiring; identifying a first length of the partial wiring and a first angle of the partial wiring for a vector; identifying combinations of second pieces of partial wiring based on the first length and the first angle, the second pieces of partial wiring having second lengths which are a certain length or more, second angles which are different by a certain angle, and a distance which is a certain distance or less; identifying a group having the combinations including pieces of identical partial wiring; and symbolizing third pieces of partial wiring at both ends of the group and fourth pieces of partial wiring between the third pieces of partial wiring.

18 Claims, 19 Drawing Sheets

FIG. 4
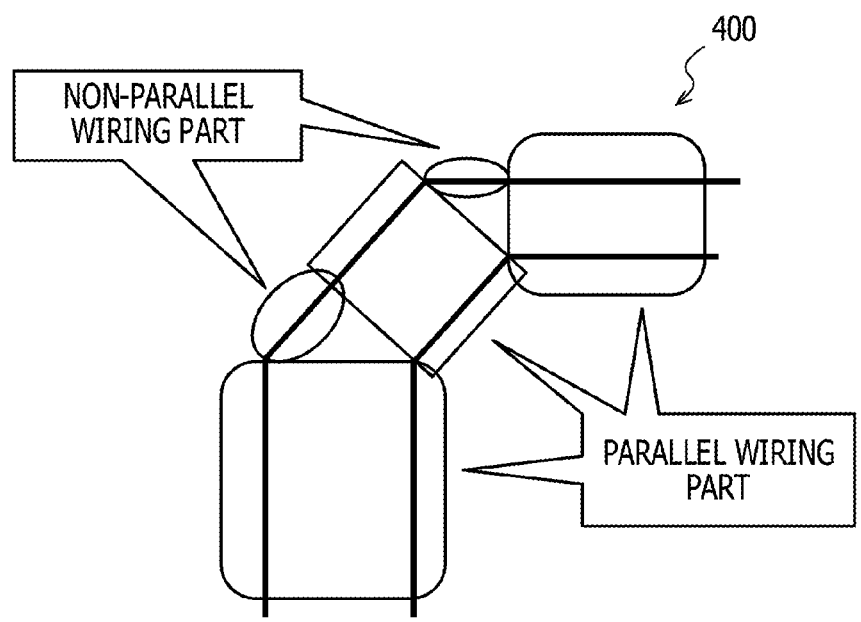
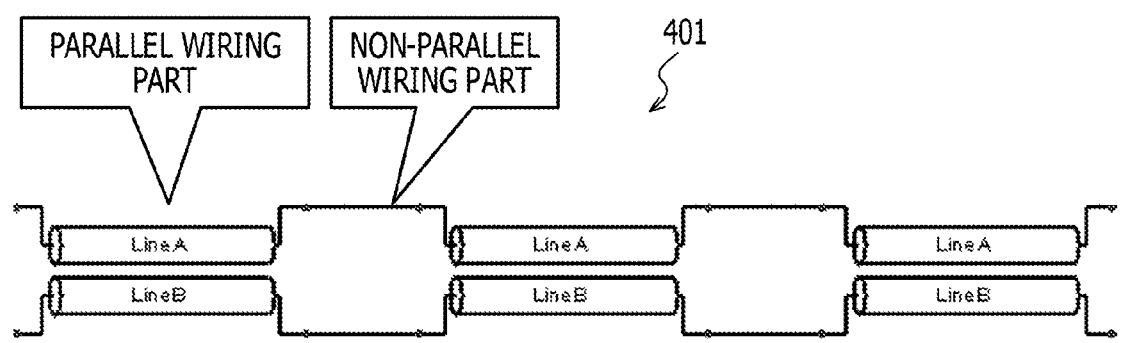

LAYOUT INFORMATION 101

- LINE TABLE

700

| X COORDINATE OF STARTING POINT | Y COORDINATE OF STARTING POINT | X COORDINATE OF ENDING POINT | Y COORDINATE OF ENDING POINT | |
|---|---|---|---|---|
| 1123 | 789 | 1123 | 858 | 701-1 |
| 1123 | 858 | 1154 | 858 | |
| 1154 | 858 | 1154 | 789 | |
| 1154 | 789 | 1175 | 789 | |
| 1175 | 789 | 1175 | 858 | |
| --- | | | | |

- VIA TABLE

710

| X COORDINATE | Y COORDINATE | FIRST LAYER NUMBER | LAST LAYER NUMBER | VIA ATTRIBUTE | |
|---|---|---|---|---|---|
| 1175 | 858 | L0 | L15 | xxxx | 711-1 |
| 286 | 378 | L1 | L12 | yyyy | |
| 578 | 900 | L0 | L15 | zzzz | |
| --- | | | | | |

- COMPONENT TABLE
- COMPONENT PIN TABLE
- NET TABLE

---

ECTOR ANGLE IS FOLLOWING ORIENTATION OF WIRING
→: 0DEGREE、↑: 90DEGREE、←: 180DEGREE、↓: 270DEGREE

| SEGMENT NAME | LENGTH [mm] | VECTOR ANGLE |
|---|---|---|
| S1 | 10 | 90DEGREE |
| S2 | 3 | 0DEGREE |
| S3 | 10 | 270DEGREE |
| S4 | 3 | 0DEGREE |
| S5 | 10 | 90DEGREE |
| S6 | 3 | 0DEGREE |
| S7 | 10 | 270DEGREE |
| S8 | 3 | 0DEGREE |

| DIFFERENCE BETWEEN VECTOR ANGLES OF SEGMENTS [DEGREE] | LENGTH OF SEGMENT ($\alpha$) [mm] | DISTANCE BETWEEN CENTER POINTS OF SEGMENT ($\beta$) [mm] | NUMBER OF SUCCESSIVE COMBINATIONS |
|---|---|---|---|
| 180 | 5 | 5 | 3 |

901

| DIFFERENCE BETWEEN VECTOR ANGLES OF SEGMENTS [DEGREE] | LENGTH OF SEGMENT ($\alpha$) [mm] | DISTANCE BETWEEN CENTER POINTS OF SEGMENT ($\beta$) [mm] | NUMBER OF SUCCESSIVE COMBINATIONS |
|---|---|---|---|
| 270 | 5 | 8 | 3 |

902

| DIFFERENCE BETWEEN VECTOR ANGLES OF SEGMENTS [DEGREE] | LENGTH OF SEGMENT ($\alpha$) [mm] | DISTANCE BETWEEN CENTER POINTS OF SEGMENT ($\beta$) [mm] | NUMBER OF SUCCESSIVE COMBINATIONS |
|---|---|---|---|
| 225 | 5 | 3 | 3 |

_903_

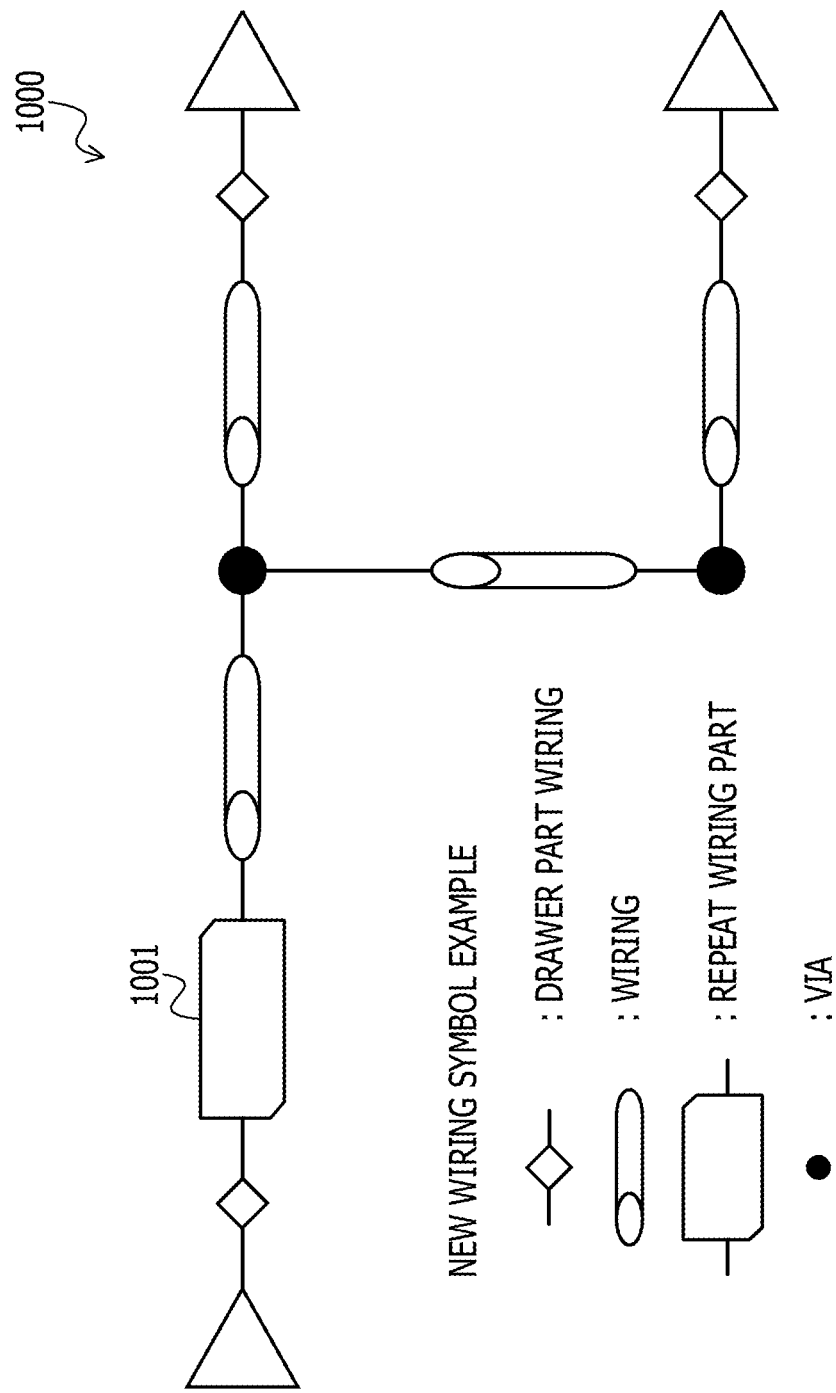

| PARALLEL WIRING PART NAME | LENGTH [mm] | VECTOR ANGLE |
|---|---|---|
| P1 | 10 | 90 DEGREE |
| P2 | 3 | 0 DEGREE |
| P3 | 10 | 270 DEGREE |
| P4 | 3 | 0 DEGREE |
| P5 | 10 | 90 DEGREE |
| P6 | 3 | 0 DEGREE |
| P7 | 10 | 270 DEGREE |

WIRING TOPOLOGY METHOD AND INFORMATION PROCESSING DEVICE

CROSS-REFERENCE TO RELATED APPLICATION

This application is based upon and claims the benefit of priority of the prior Japanese Patent Application No. 2014-237725, filed on Nov. 25, 2014, the entire contents of which are incorporated herein by reference.

FIELD

The embodiments discussed herein are related to a wiring topology method and an information processing device.

BACKGROUND

The wiring state of wiring that couples components on a printed board is displayed using topology in development of a device using the printed board or the like.

Related technologies are discussed in Japanese Laid-open Patent Publication No. 2010-39598, Japanese Laid-open Patent Publication No. 2000-123060, and Japanese Laid-open Patent Publication No. 9-325973.

SUMMARY

According to an aspect of the embodiments, a wiring topology display method, includes: obtaining layout information indicating positions of components included in a target circuit and a position of wiring that couples the components; dividing, by a computer, first wiring included in the target circuit into first pieces of partial wiring, under a condition, based on the layout information, and generating partial wiring information indicating the first pieces of partial wiring; identifying, for each of the first pieces of partial wiring, a first length of the partial wiring and a first angle of the partial wiring for a vector of a space indicated by the layout information based on orientation of each of the first pieces of partial wiring; identifying, from among the first pieces of partial wiring, one or more combinations of second pieces of partial wiring based on the first length and the first angle, the second pieces of partial wiring having second lengths which are a certain length or more, second angles which are different by a certain angle, and a distance between the second pieces of partial wiring which is a certain distance or less; identifying, from among the one or more combinations, a group having the combination including pieces of identical partial wiring; and symbolizing third pieces of partial wiring at both ends of the group and fourth pieces of partial wiring between the third pieces of partial wiring.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 illustrates an example of making a topology;

FIG. 10 illustrates an example of a topology;

DESCRIPTION OF EMBODIMENTS

For example, when the wiring state of a printed board having a multi-layer is displayed using topology, the presence or absence of wiring of an adjacent layer is displayed. For example, when a line diagram is displayed based on design information of the printed board, a parallel line that has been designed in parallel to the wiring path within a certain distance is displayed at the same time. For example, a model diagram of a line system is created using the layout diagram, and a configuration part including a circuit component and a transmission line is displayed as symbols.

When a device is developed, the length of wiring that couples components on a printed board is specified. In this case, in a layout system, in order to obtain the specified length, repeat wiring is generated in which a comb shape, a mountain shape, a saw shape, or the like, is repeated. Such repeat wiring is treated as straight-line wiring when displaying topology.

For example, when a verifier analyzes an electrical characteristic of the wiring or the like using the topology display, the verifier may miss an electrical characteristic related to the repeat wiring. A long time may be taken when the verifier visually checks the repeat wiring from the layout diagram.

Figure 1:
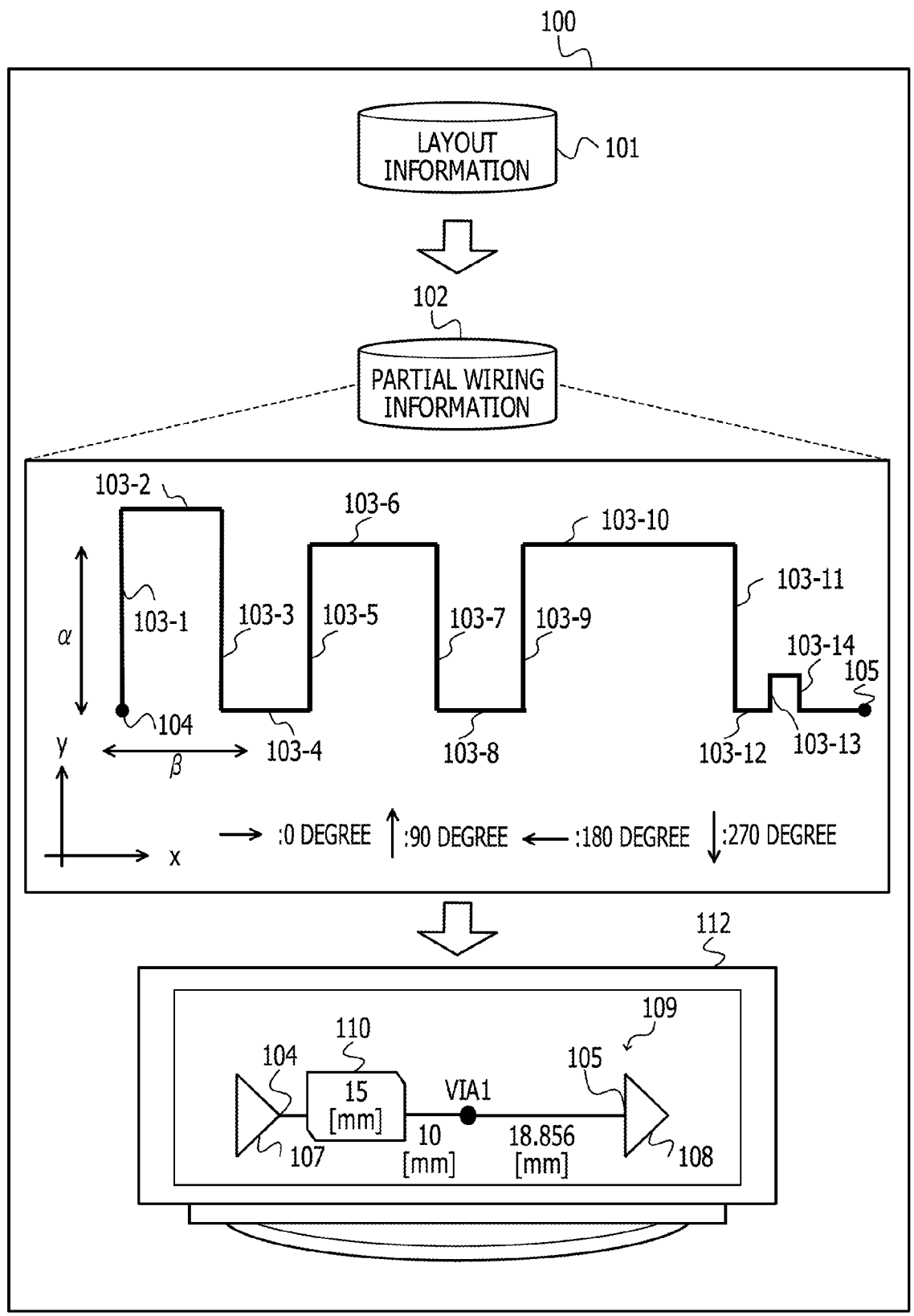
FIG. 1 illustrates an example of an operation of an information processing device.

FIG. 1 illustrates an example of an operation of an information processing device. An information processing device 100 may be a computer that symbolizes a repeat wiring part included in a target circuit and displays the symbolized repeat wiring when displaying a topology. The topology is, for example, a diagram in which the wiring state of the target circuit extracted from the layout information is displayed on a display 112 or the like.

By specifying the wiring length at the time of layout by a designer of the target circuit, timing of the target circuit is adjusted. In a layout system capable of layout processing, wiring is arranged so that the specified wiring length is obtained by arranging repeat wiring automatically. The repeat wiring is generated in which a comb shape, a mountain shape, a saw shape, or the like is repeated.

The verifier analyzes an electrical characteristic of wiring and the like using the topology display. Due to speed-up of an operation frequency of the target circuit, the coupling capacity generated in the repeat wiring part causes arrival of a signal that flows through the repeat wiring part to arrive early. Therefore, the verifier may check the electrical characteristic of the repeat wiring part after completion of the layout. The electrical characteristic may be, for example, a delay time or the like. For example, the repeat wiring is treated as straight-line wiring when displaying the topology, so that the verifier may miss the electrical characteristic of the repeat wiring part when the verifier analyzes the electrical characteristics using the displayed topology. It might be time-consuming when the verifier checks the repeat wiring visually in accordance with the layout diagram.

The information processing device 100 specifies a group of the certain number of successive combinations from combinations of pieces of partial wiring that satisfy a shape condition of a repeat wiring part of the length, the angle, and the distance, as a repeat wiring part, and symbolizes the group. Therefore, the topology of the repeat wiring part may be visually obtained.

The information processing device 100 obtains layout information 101 indicating the position of components that are included in the designed target circuit and the position of wiring that couples the components. The information processing device 100 may obtain the layout information 101, for example, by reading the layout information 101 from a storage device, or may obtain the layout information 101 from a further device through a network or the like.

The information processing device 100 generates, based on the obtained layout information 101, partial wiring information 102 indicating a plurality of pieces of the partial wiring 103 obtained by dividing, under a certain condition, certain wiring from a starting point 104 to an ending point 105, which is included in the target circuit. For example, the starting point 104 may be an output terminal on the signal output side from among two components that the certain wiring couples. For example, the ending point 105 may be an output terminal on the signal input side, from among the two components that the certain wiring couples. For example, the starting point 104 may be an output terminal of a driver 107. For example, the ending point 105 may be an input terminal of a driver 108. The certain wiring may be, for example, wiring that couples components. For example, the certain wiring may be specified by the verifier, or may be selected as non-processed wiring from a plurality of pieces of wiring included in the target circuit by the information processing device 100.

The information processing device 100 identifies the length of the partial wiring 103 and the angle of the partial wiring 103, for each of the plurality of pieces of partial wiring 103 indicated by the partial wiring information 102. The angle of the partial wiring 103 is an angle of the partial wiring 103 for a certain vector of a space indicated by the layout information 101 based on the orientation of the partial wiring 103 from the starting point 104 to the ending point 105. The angle of the partial wiring 103 may be referred to as a vector angle. The space indicated by the layout information 101 may be, for example, a virtual two-dimensional space used to display the layout of the target circuit on a computer. For example, the space indicated by the layout information 101 may be a space that has been set virtually by two-dimensional computer aided design (CAD) in order to design the target circuit. To the space indicated by the layout information 101, for example, a two-dimensional orthogonal coordinate system including an x axis and a y axis is defined.

The information processing device 100 identifies a combination of two pieces of partial wiring 103, in which both of the lengths of the pieces of partial wiring 103 are a certain length α or more, and the angles of the pieces of partial wiring 103 are different by a certain angle, and the distance of the pieces of the partial wiring 103 is within a certain distance β, from among combinations each of which includes two pieces of partial wiring 103. The combination of the pieces of partial wiring 103 may be a combination of two pieces of the partial wiring 103 from among the plurality of pieces of partial wiring 103. The certain length α, the certain angle, and the certain distance β may be defined, for example, by the verifier. The distance between the pieces of partial wiring 103 of the combination is a distance of a perpendicular line between the pieces of partial wiring 103 of the combination.

In the partial wiring 103 having a short length, the electrical characteristic corresponds to a practically-straight line, so that the partial wiring 103 may not be identified as a repeat wiring part. Therefore, as a certain condition of a combination, the certain length α or more is set. When the angles of the pieces of partial wiring 103 of the combination are set as the certain condition of the combination, a certain shape such as a comb shape, a mountain shape, or a saw shape is identified as a repeat wiring part. The certain angle may be set, for example, at 180 degree in the case of the comb shape illustrated in FIG. 1. When the distance of the perpendicular line between the pieces of partial wiring 103 of the combination is large, the coupling capacity is not affected, the condition of the certain distance β or less is set as the certain condition of the combination. For example, a combination of partial wiring 103-1 and partial wiring 103-3, a combination of the partial wiring 103-3 and partial wiring 103-5, a combination of the partial wiring 103-5 and partial wiring 103-7, and a combination of the partial wiring 103-7 and partial wiring 103-9 may be identified. A combination of the partial wiring 103-9 and partial wiring 103-11 may not be identified because the distance of the perpendicular line is larger than the certain distance β. A combination of the partial wiring 103-11 and partial wiring 103-13 and a combination of the partial wiring 103-13 and partial wiring 103-14 may also not be identified because at least one of the lengths of the pieces of partial wiring 103 is shorter than the certain length α.

The information processing device 100 identifies a group having the certain number of combinations including identical partial wiring 103 from among the identified combinations. The certain number may be set in advance, for example, by the verifier. For example, the certain number may be three. For example, the information processing device 100 may identify the combination of the partial wiring 103-1 and the partial wiring 103-3, the combination of the partial wiring 103-3 and the partial wiring 103-5, the combination of the partial wiring 103-5 and the partial wiring 103-7, and the combination of the partial wiring 103-7 and the partial wiring 103-9, as the combination group.

When the information processing device 100 displays the target circuit using topology based on the layout information 101, wiring including two pieces of partial wiring 103 at both ends of the identified combination group and pieces of partial wiring 103 between the two pieces of partial wiring 103 at both of the ends of the identified combination group are symbolized, from among a plurality of pieces of partial wiring 103, and the symbolized wiring is displayed. The wiring including the two pieces of partial wiring 103 at both of the ends of the identified combination group and the pieces of partial wiring 103 between the two pieces of partial wiring 103 at both of the ends of the identified combination group is a repeat wiring part. In topology 109, the wiring state between the driver 107 and the driver 108 is indicated by the driver 107, a symbol 110 of the repeat wiring part, a VIA 1, and the driver 108. For example, the information processing device 100 displays the topology 109 on the display 112. The information processing device 100 may set information on at least one of the length of the repeat wiring part, the shape of the repeat wiring part, and the number of combinations included in the identified combination group, for example, to the symbol 110.

Therefore, the topology of the repeat wiring part may be visually obtained. The electrical characteristic is easily checked using the topology, and the efficiency of the verification may be achieved.

Figure 2A:
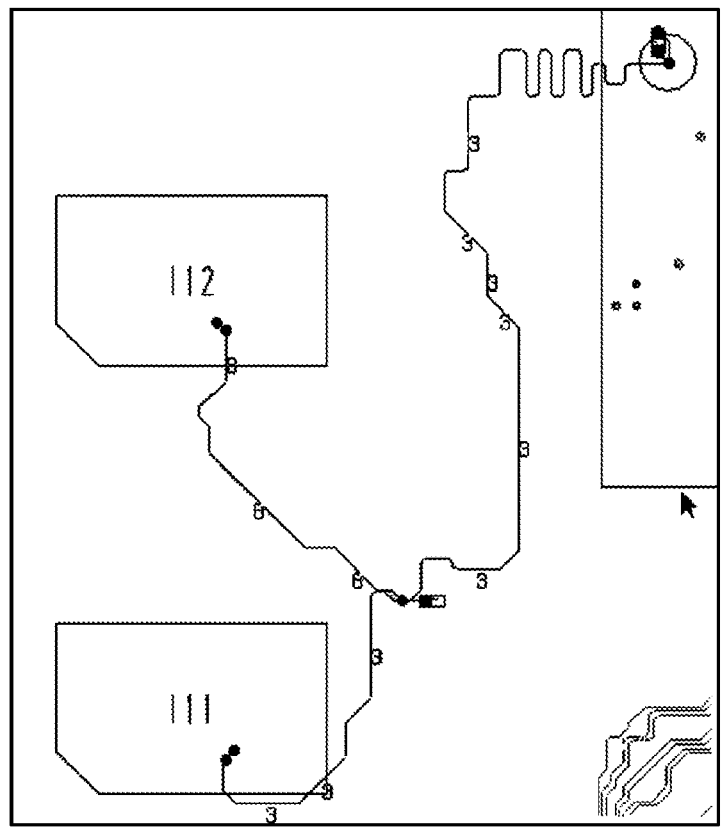
FIGS. 2A and 2B illustrate an example of a layout of a substrate including a repeat wiring.
Figure 2B:
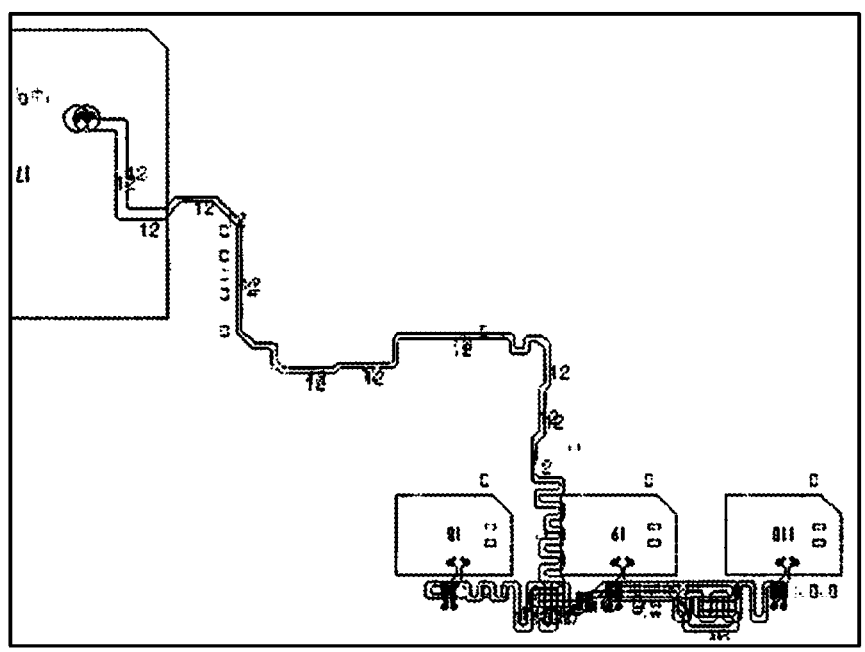

FIGS. 2A and 2B illustrate an example of a layout of a substrate including a repeat wiring. The diagram displayed on the display 112 or the like based on the layout information may be referred to as a layout diagram. FIG. 2A is a diagram illustrating an example of single-ended wiring, and FIG. 2B is a diagram illustrating an example of differential wiring.

The designer adjusts timing of the target circuit by specifying the wiring length at the time of layout. In a case in which a single transmission path is formed by a single signal line, when repeat wiring is formed in the transmission path, the single-ended wiring as illustrated in FIG. 2A is formed. In a case in which a single transmission path is formed by a combination of two signal lines, when repeat wiring is formed in the transmission path, the differential wiring illustrated in FIG. 2A is formed.

Figure 3A:
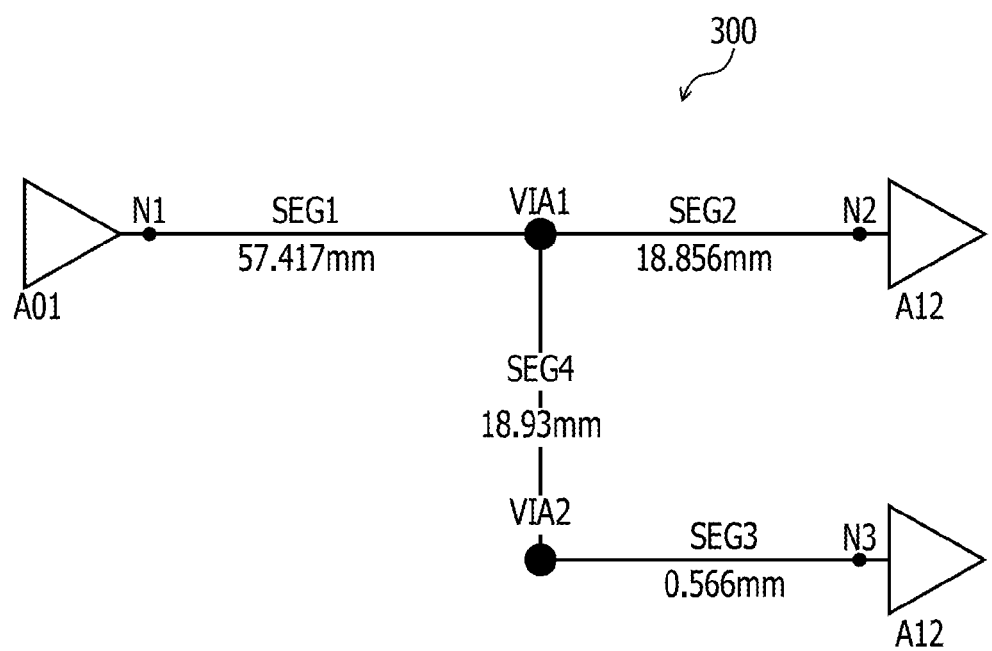
FIGS. 3A and 3B illustrate an example of a topology.
Figure 3B:

FIGS. 3A and 3B illustrate an example of a topology. For example, a diagram in which the wiring state of a circuit extracted from layout information is displayed on the display 112 or the like may be referred to using topology. In FIG. 3A, an example of a topology of single-ended wiring is illustrated. In FIG. 3B, an example of a topology of wiring including differential wiring is illustrated.

In topology 300 illustrated in FIG. 3A, it is indicated that a buffer A01 and a buffer A12 are coupled to each other through the VIA 1. In addition, in the topology 300 illustrated in FIG. 3A, it is indicated that the buffer A01 and a buffer A12 are coupled to each other through a VIA 2. In the topology 300 illustrated in FIG. 3A, for example, the length of partial wiring SEG1 that couples the buffer A01 and the VIA 1 may be 57.417 [mm]. In the topology 300 illustrated in FIG. 3A, for example, the length of partial wiring SEG2 that couples the VIA 1 and the buffer A12 may be 18.856 [mm]. In the topology 300 illustrated in FIG. 3A, for example, the length of partial wiring SEG4 that couples the VIA 1 and the VIA 2 may be 18.93 [mm]. In the topology 300 illustrated in FIG. 3A, for example, the length of partial wiring SEG3 that couples the VIA 2 and the buffer A12 may be 0.566 [mm].

In topology 301 of the wiring including the differential wiring illustrated in FIG. 3B, it may be difficult for the verifier to determine a repeat wiring part.

FIG. 4 illustrates an example of making a topology. In FIG. 4, an example of making a topology of differential wiring is illustrated. The topology of differential wiring 400 is made by extracting the wiring state of a circuit from layout information and classifying the wiring into a parallel wiring part and a non-parallel wiring part. Therefore, it may be difficult for the designer to recognize a repeat wiring part in displayed topology 401.

Figure 5:
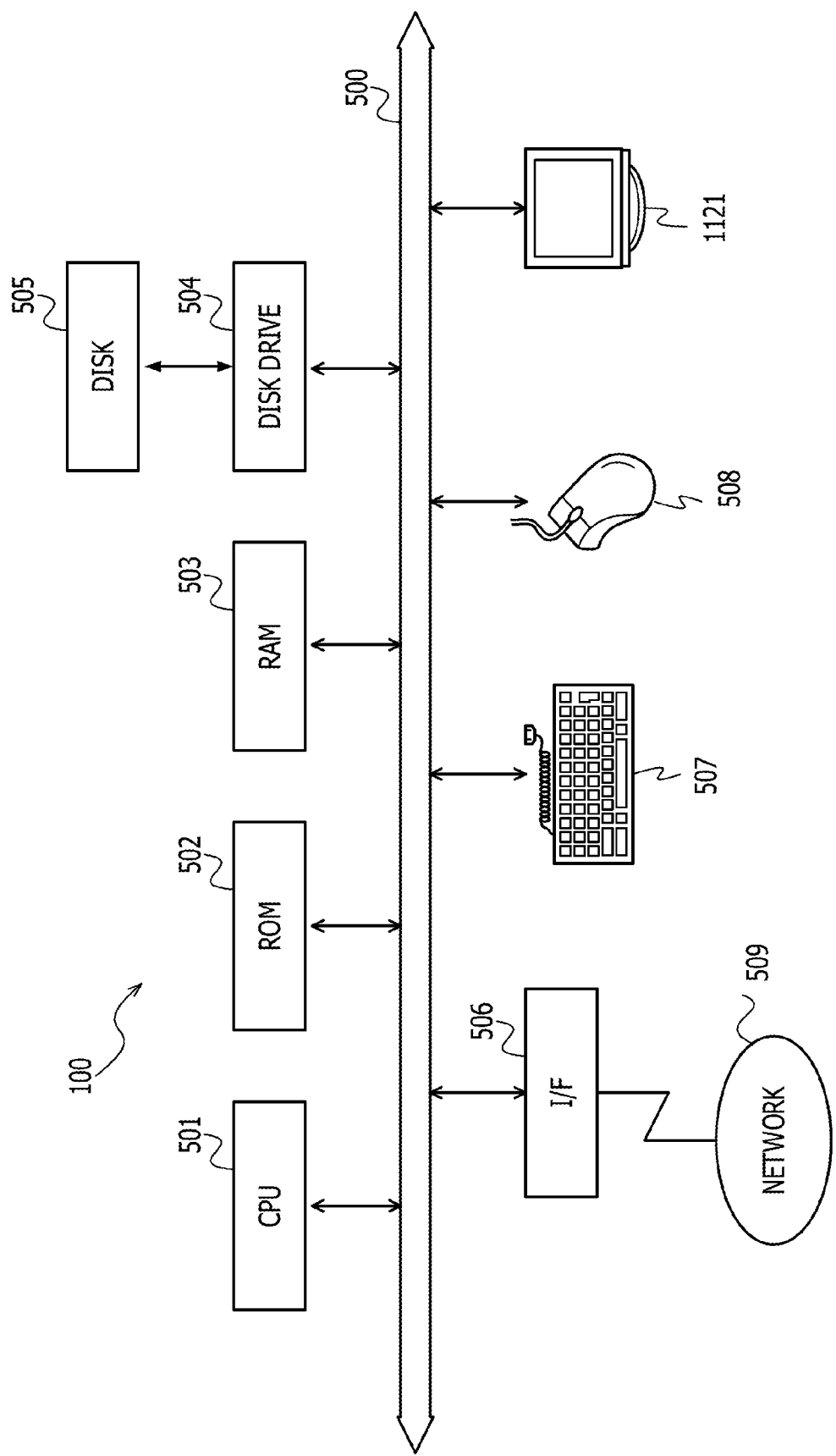
FIG. 5 illustrates an example of a hardware configuration of an information processing device.

FIG. 5 illustrates an example of a hardware configuration of an information processing device. The information processing device 100 illustrated in FIG. 5 includes a central processing unit (CPU) 501, a read only memory (ROM) 502, a random access memory (RAM) 503, a disk drive 504, and a disk 505. The information processing device 100 further includes an interface (I/F) 506, a keyboard 507, a mouse 508, and the display 112. The units are coupled to each other through a bus 500.

The CPU 501 controls the whole information processing device 100. The ROM 502 stores a program such as a boot program. The RAM 503 is used as a work area of the CPU 501. The disk drive 504 controls of read/write of data for the disk 505 in accordance with the control of the CPU 501. The disk 505 stores data written by the control of the disk drive 504. The disk 505 includes a magnetic disk, an optical disk, and the like.

The I/F 506 is coupled to a network 509 such as a local area network (LAN), a wide area network (WAN), or the Internet through a communication line, and is coupled to a further device through the network 509. The I/F 506 administers the network 509 and an internal interface, and controls input and output of data from and to an external device. As the I/F 506, for example, a modem, a LAN adapter, or the like, may be employed.

To the interfaces such as the keyboard 507 and the mouse 508, various pieces of data are input by an operation from a user. The display 112 is an interface that outputs data based on an instruction of the CPU 501. In the information processing device 100, a touch-screen, a device that takes in audio through a microphone, an input device such as a device that takes in an image or video through a camera, and an output device such as a printer may be provided.

Figure 6:
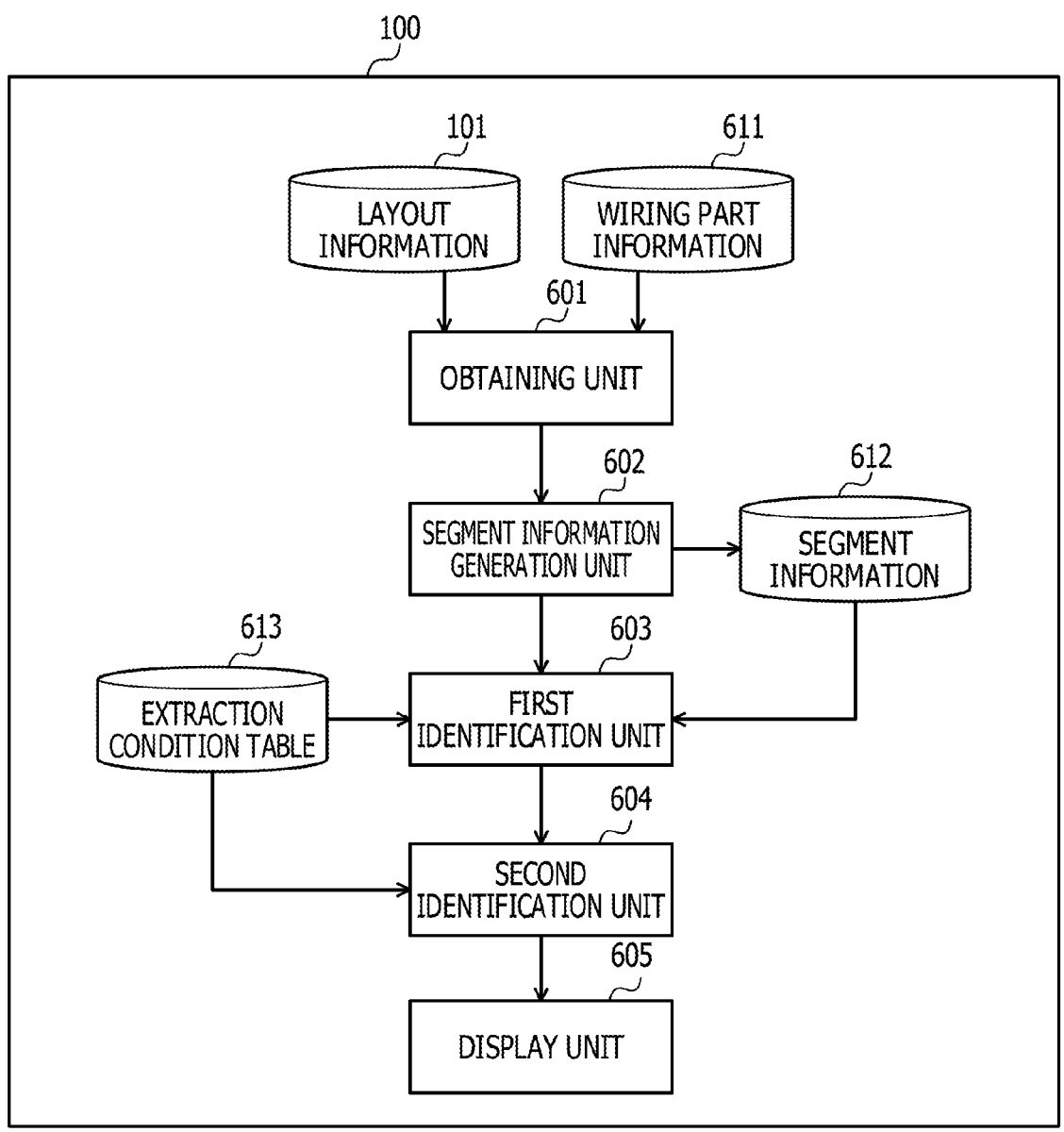
FIG. 6 illustrates an example of a functional configuration of an information processing device.

FIG. 6 illustrates an example of a functional configuration of an information processing device. The information processing device 100 includes an obtaining unit 601, a segment information generation unit 602, a first identification unit 603, a second identification unit 604, and a display unit 605. The processing of the control units such as the obtaining unit 601, the segment information generation unit 602, the first identification unit 603, the second identification unit 604, and the display unit 605 is coded, for example, in a program stored in the storage device such as the ROM 502, the RAM 503, or the disk 505 that the CPU 501 illustrated in FIG. 5 is allowed to access. The CPU 501 reads the program from the storage device, and executes the processing that has been coded in the program. Therefore, the processing of the control units is achieved. The processing result of the control units is stored, for example, in the storage device such as the RAM 503, the ROM 502, or the disk 505.

For example, a single-ended repeat wiring part may be symbolized and displayed. For example, a repeat wiring part of differential wiring may be symbolized and displayed.

A group having the number of successive combinations is identified as a repeat wiring part from among combinations each of which includes pieces of partial wiring that satisfy a condition of the repeat wiring shape of the length, the angle, and the distance. The identified repeat wiring part is symbolized and displayed. The topology of the repeat wiring part may be visually obtained. Therefore, the verifier may check the electrical characteristic easily using the topology, and the efficiency of the verification may be achieved.

The obtaining unit 601 obtains the layout information 101. For example, the obtaining unit 601 may obtain the layout information 101, for example, by reading the layout information 101 from the storage device such as the RAM 503, the ROM 502, or the disk 505. The obtaining unit 601 may obtain the layout information 101, for example, from a further device through the network 509.

Figure 7:
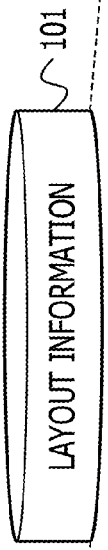
FIG. 7 illustrates an example of layout information.

FIG. 7 illustrates an example of layout information. The layout information 101 includes, for example, a line table 700, a via table 710, a component table, a component pin table, a net table, and the like.

The line table 700 includes, for example, information indicating the positions of a starting point and an ending point of wiring. The line table 700 includes, for example, fields of the X coordinate of the starting point, the Y coordinate of the starting point, the X coordinate of the ending point, the Y coordinate of the ending point, and the like. When information is set to each of the field, the information is stored as a record 701. For example, in a record 701-1, "1123" is set to the field of the X coordinate of the starting point, and "789" is set to the field of the Y coordinate of the starting point. In the record 701-1, "1123" is set to the field of the X coordinate of the ending point, and "858" is set to the field of the Y coordinate of the ending point.

The via table 710 includes, for example, information indicating the position of a via, layers of the via, and the like. The via table 710 includes, for example, fields of an X coordinate, a Y coordinate, the first layer number, the last layer number, the attribute, and the like, of the via. When information is set to each of the fields, the information is stored as a record 711. To each of the fields of the first layer number and the last layer number, a number in each layer of wiring to which the via is coupled is set.

In a record 711-1, "1175" is set to the field of the X coordinate, and "858" is set to the field of the Y coordinate. In the record 711-1, "L0" is set to the field of the first layer number, and "L15" is set to the field of the last layer number. In the record 711-1, "xxxx" is set to the field of the attribute of the via.

For example, based on the obtained layout information 101, the segment information generation unit 602 generates the partial wiring information 102 indicating the plurality of pieces of partial wiring obtained by dividing, under a certain condition, certain wiring from the starting point to the ending point, which is included in the target circuit. The partial wiring may be referred to as a segment, and the partial wiring information 102 may be referred to as segment information 612. The certain condition may include, for example, at least one of the positions of a via, a terminal of a component, a turnoff point on the certain wiring, a branch point on the certain wiring that are included in the target circuit.

Figures 8A, 8B:
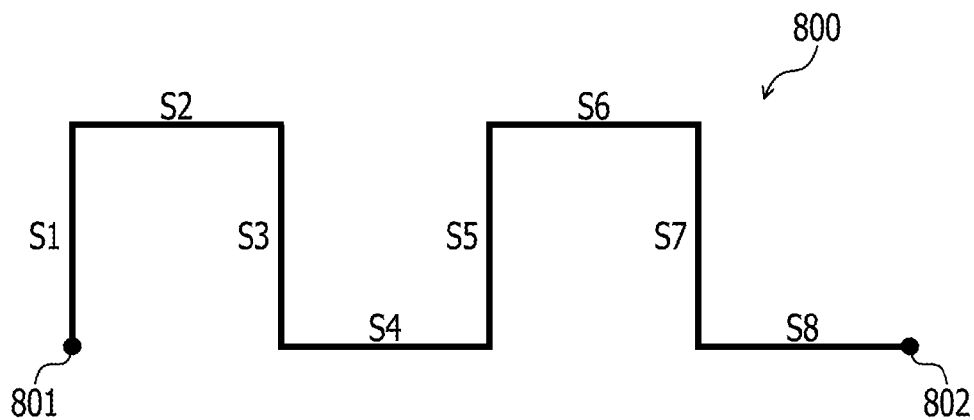
FIG. 8A and FIG. 8B illustrate an example of a segment division.

FIG. 8A and FIG. 8B illustrate an example of a segment division. For example, the segment information generation unit 602 divides certain wiring 800 into S1 to S8 in order from a starting point 801 to an ending point 802. The segment information generation unit 602 generates the segment information 612 indicating the divided segments. The segment information 612 is stored, for example, in the storage device such as the RAM 503, the ROM 502, or the disk 505.

For example, for each of the segments indicated by the segment information 612, the first identification unit 603 identifies the length of the segment and the vector angle of the segment. The vector angle of the segment is defined, for example, by the orientation of wiring from the starting point. The vector angle of the segment is an angle of the segment for a certain vector in a space indicated by the layout information 101 based on the orientation of the pieces of partial wiring from the starting point 801 to the ending point 802. The certain vector may be a vector specified by the verifier, or may be an axis such as an x axis or a y axis defined in the space indicated by the layout information 101. In FIGS. 8A and 8B, the x axis may be set as the certain vector. The first identification unit 603 adds the identification result to the segment information 612.

The segment information 612 includes, for example, fields of the segment name, the length, and the vector angle. When information is set to each of the fields, the information is stored as a record 811. Identification information used to identify a segment is set to the field of the segment name. For example, the length of the segment is set to the field of the length. For example, the vector angle of the segment is set to the field of the vector angle. To the segment information 612, for example, registration is performed in order from a record 811-1 related to a segment including the starting point 801. Therefore, the segment information 612 and the layout information 101 are associated with each other by the starting point 801 and the ending point 802. The starting point 801 to the ending point 802, and the like, of the segments may be identified by the layout information 101. In the record 811-1, for example, "S1" is set to the field of the segment name, and "10" is set to the field of the length, and "90 degree" is set to the field of the vector angle.

The second identification unit 604 identifies a combination in which lengths of segments are a certain length or more, and angles of the segments are different by a certain angle, and a distance between the segments is a certain distance or less. For example, the second identification unit 604 identifies a combination that corresponds to each extraction condition described in an extraction condition table 613, from combinations each of which includes two segments that are to be obtained from the plurality of segments, based on the length and the vector angle, for each of the segments.

For example, the second identification unit 604 identifies a combination group having the certain number of successive combinations each including identical partial wiring, from the identified combinations. For example, the second identification unit 604 identifies a shape matched with a basic shape of repeat wiring, based on the extraction condition described in the extraction condition table 613.

Figures 9A, 9B, 9C:
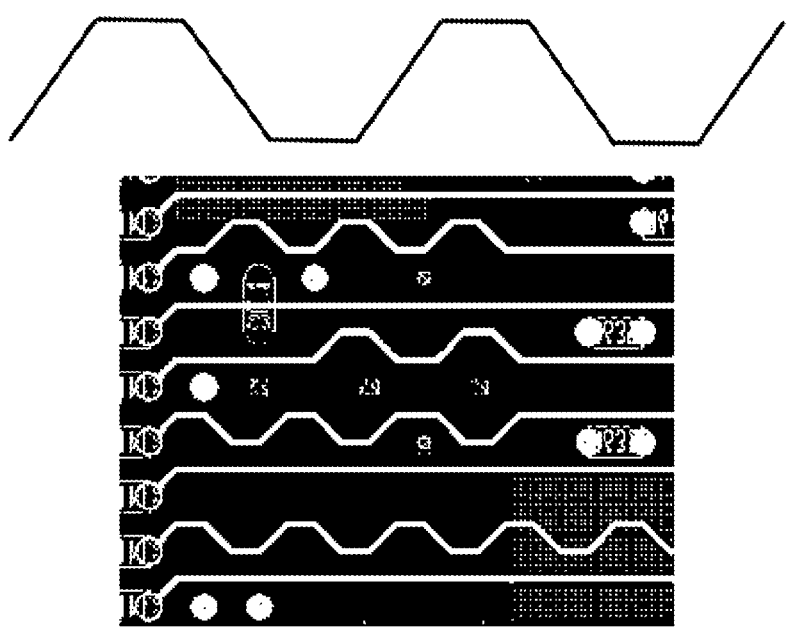
FIGS. 9A to 9E illustrate an example of an extraction condition table.
Figures 9D, 9E:
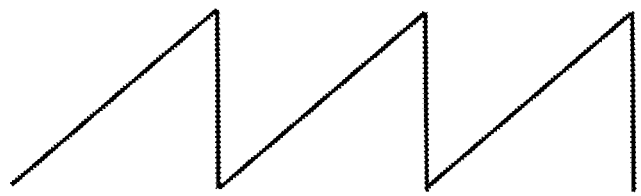

FIGS. 9A to 9E illustrate an example of an extraction condition table. For example, FIG. 9A illustrates an extraction condition table 901 used to identify repeat wiring of a comb shape. FIG. 9B illustrates an extraction condition table 902 used to identify repeat wiring of a mountain shape. FIG. 9C illustrates sampling wiring of the mountain shape. FIG. 9D illustrates an extraction condition table 903 used to identify repeat wiring of a saw shape. FIG. 9E illustrates sampling wiring of the saw shape.

In each of the extraction condition tables 901 to 903, fields of a difference between the vector angles of the segments, the lengths of the segments, a distance between the center points of the segments, the number of successive combinations, and the like are stored. A certain angle is set to the field of the difference between the vector angles of the segments. A certain length is set to the field of the lengths of the segments. A certain distance is set to the field of the distance between the center points of the segments. Each of the extraction condition tables 901 to 903 is achieved, for example, by the storage device such as the ROM 502, the RAM 503, or the disk 505.

In the extraction condition table 901 illustrated in FIG. 9A, "180" is set to the field of the difference between the vector angles of the segments. "5" is set to the field of the lengths of the segments. "5" is set to the field of the distance between the center points of the segments. "3" is set to the field of the number of successive combinations.

The mountain shape is the shape as illustrated in the sample wiring diagram of FIG. 9C. In the extraction condition table 902 illustrated in FIG. 9B, "270" is set to the field of the difference between the vector angles of the segments. "5" is set to the field of the lengths of the segments. "8" is set to the field of the distance between the center points of the segments. "3" is set to the field of the number of successive combinations.

The saw shape is the shape as illustrated in the sample wiring diagram of FIG. 9E. In the extraction condition table 903 illustrated in FIG. 9D, "225" is set to the field of the difference between the vector angles of the segments. "5" is set to the field of the lengths of the segments. "3" is set to the field of the distance between the center points of the segments. "3" is set to the field of the number of successive combinations.

For example, the second identification unit 604 identifies a combination in which a difference between angles of segments is 180 degree, as a candidate combination, from available combinations each of which includes two segments. For example, the second identification unit 604 identifies a candidate combination in which the length of each of the segments is 5 [mm], and a distance between the center points of the segments is 5 [mm], from among the identified candidate combinations.

A difference between vector angles of the S1 and the S3 is, for example, 180 degree. The lengths of each of the S1 and the S3 is, for example, 10 [mm] that is the certain length of 5 [mm] or more. A distance of the center points between the S1 and the S3 is, for example, 3 [mm] that is the certain distance of 5 [mm] or less. Therefore, a combination of the S1 and the S3 may be set as the candidate combination. A combination of the S3 and the S5 and a combination of the S5 and the S7 may also be set as the candidate combination.

The second identification unit 604 identifies a set of the combination of the S1 and the S3, the combination of the S3 and the S5, and the combination of the S5 and the S7, as a combination group that includes three, which is the certain number, or more repeated combinations.

For example, when the target circuit is displayed using topology based on the layout information 101, the display unit 605 symbolizes and displays segments at both ends of the identified combination group, and segments between the segment at both of the ends of the identified combination group, from among the plurality of segments. For example, the display unit 605 symbolizes the S1 to the S7 that are segments at both of the ends of the combination group as a repeat wiring part. The display unit 605 generates topology to which the symbol of the repeat wiring part is added, and displays the generated topology on the display 112 or the like.

FIG. 10 illustrates an example of a topology. In FIG. 10, a diagram of single-ended topology is illustrated. In topology 1000, a rectangular part is a symbol 1001 obtained by symbolizing a repeat wiring part.

Figure 11:
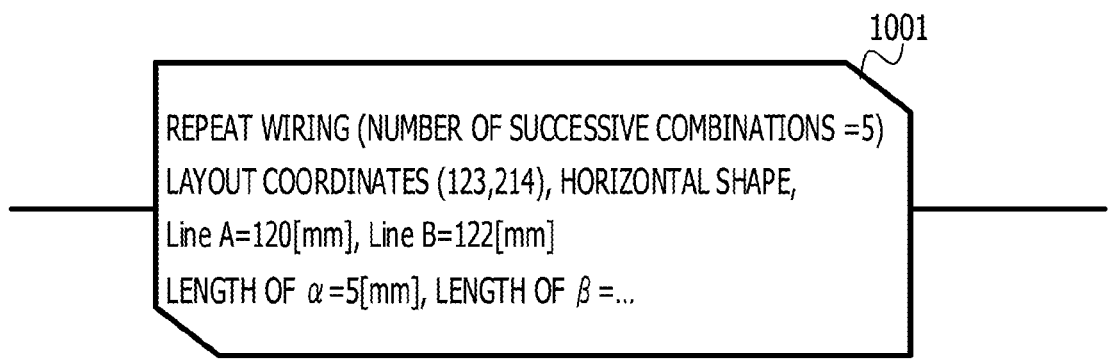
FIG. 11 illustrates an example of a symbol of repeat wiring.

FIG. 11 illustrates an example of a symbol of repeat wiring. For example, information including the number of successive combinations, the layout coordinates of the repeat wiring, the shape of the repeat wiring, the total wiring length of the repeat wiring part, and the length of each repeat part may be set to the symbol 1001. As the shape of the repeat wiring, for example, information indicating a vertical shape or horizontal shape based on the vector angles, the vector angle of at least one of the segments, and the like, may be set. For example, in a case of repeat wiring having a combination of a segment the vector angle of which is 180 degree and a segment the vector angle of which is 0 degree, the shape is a vertical shape. In a case of repeat wiring having a combination of a segment the vector angle of which is 90 degree and a segment the vector angle of which is 270 degree, the shape is a horizontal shape. The display unit 605 displays the image such as the comb shape, the mountain shape, or the saw shape of the extraction condition illustrated in FIG. 9, as the shape of the repeat wiring.

Figure 12:
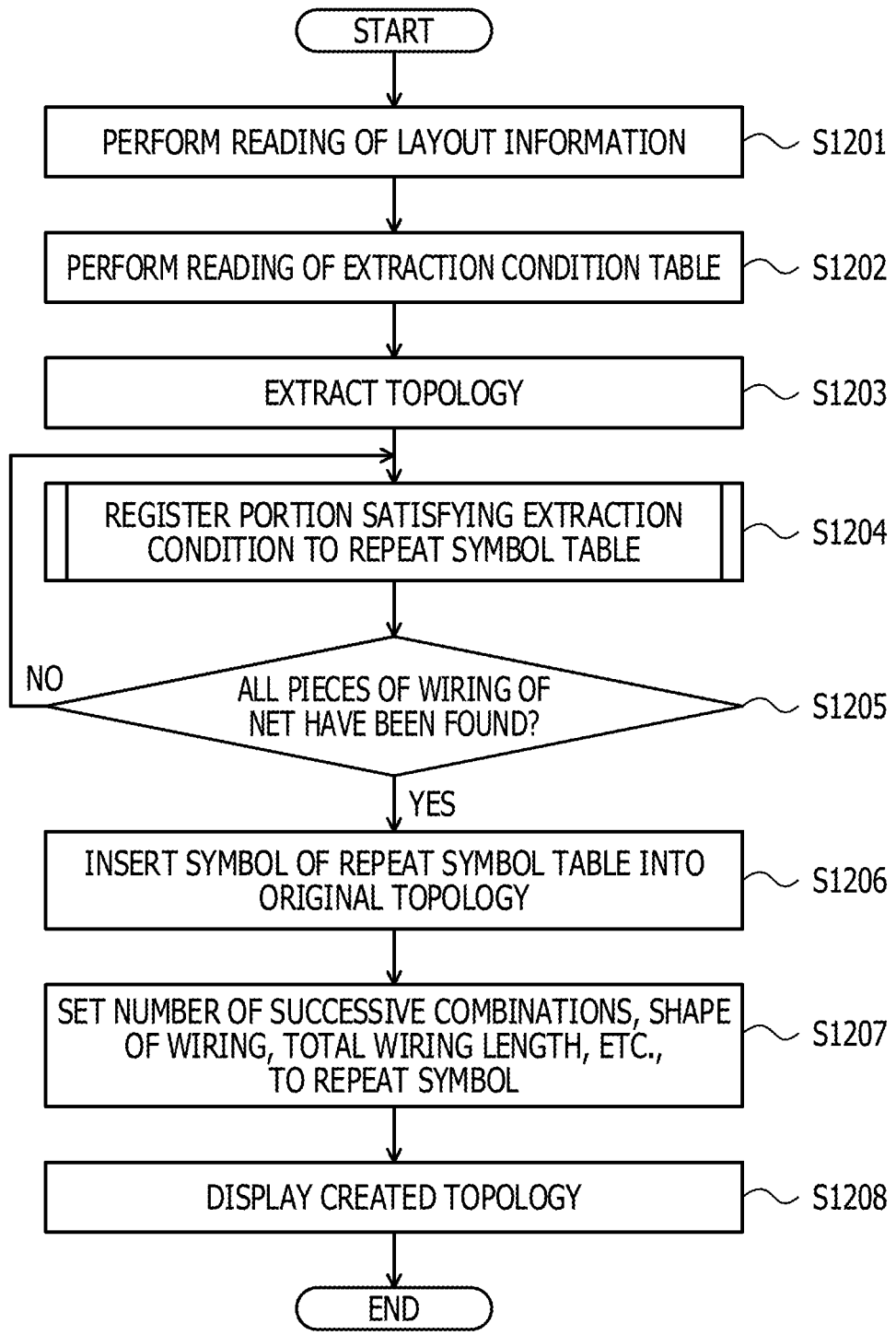
FIG. 12 illustrates an example of a topology display processing.

FIG. 12 illustrates an example of a topology display processing. The information processing device illustrated in FIG. 5 or 6 may execute the topology display processing illustrated in FIG. 12. The information processing device 100 performs reading of the layout information 101 (Operation S1201). The information processing device 100 performs reading of the extraction condition table 613 (Operation S1202).

The information processing device 100 extracts topology (Operation S1203). The information processing device 100 registers a portion that satisfies an extraction condition to a repeat symbol table (Operation S1204). The information processing device 100 determines whether all of the pieces of wiring of the net of the target circuit indicated by the layout information 101 have been searched (Operation S1205).

When the information processing device 100 determines that not all of the pieces of wiring have been searched (Operation S1205: No), the processing returns to Operation S1204. When the information processing device 100 determines that all of the pieces of wiring have been searched (Operation S1205: Yes), the information processing device 100 inserts the symbol of the repeat symbol table into the original topology (Operation S1206).

The information processing device 100 sets the number of successive combinations, the shape of the wiring, the total wiring length, and the like, to the repeat symbol (Operation S1207). The information processing device 100 displays the created topology (Operation S1208), and a series of the pieces of processing ends.

Figure 13:
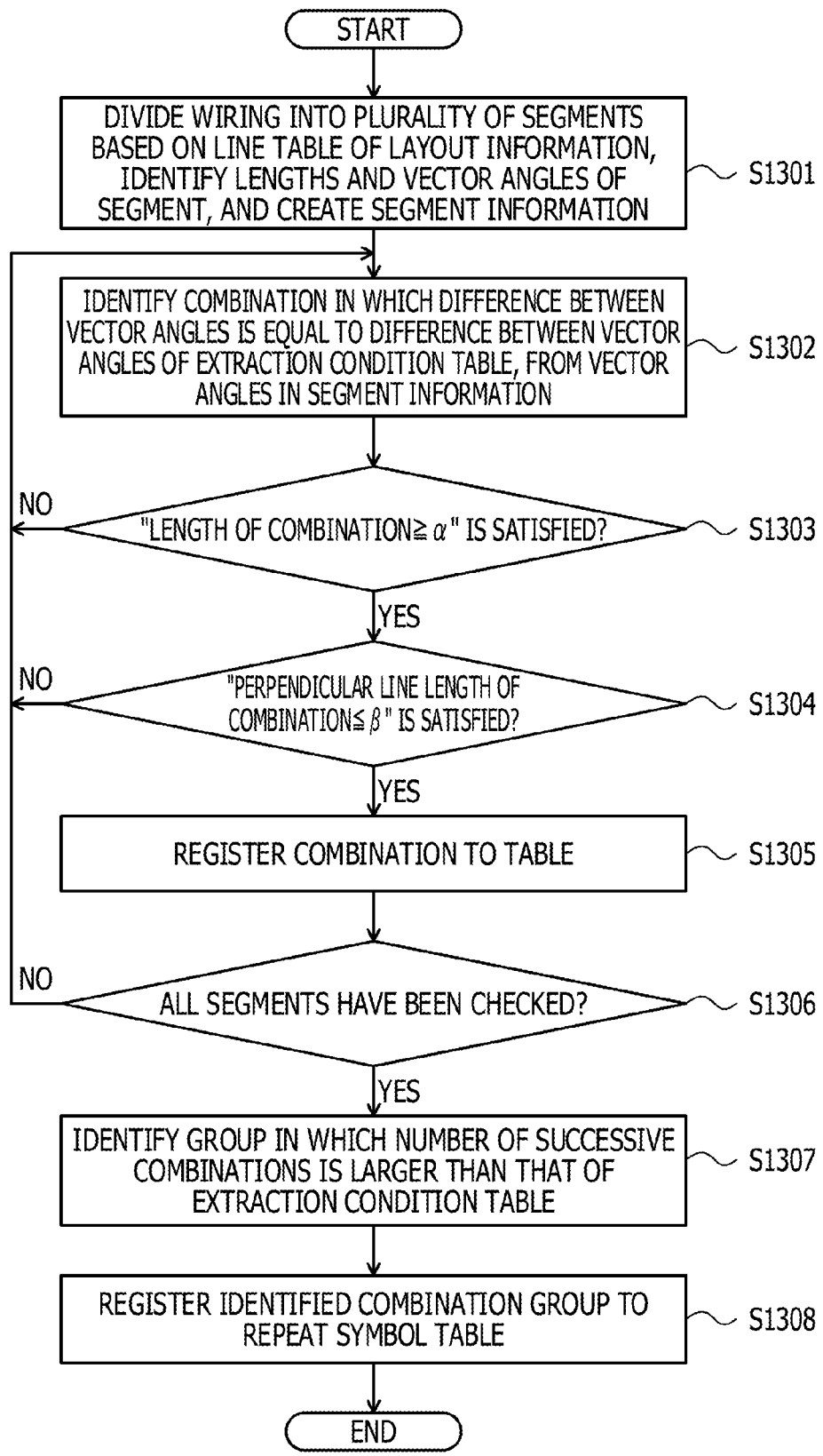
FIG. 13 illustrates an example of a registration processing to a repeat symbol table.

FIG. 13 illustrates an example of a registration processing to a repeat symbol table. The processing illustrated in FIG. 13 may correspond to the processing of registration to the repeat symbol table illustrated in FIG. 12 (Operation S1204). The information processing device 100 divides wiring into a plurality of segments, based on the line table 700 of the layout information 101, identifies the lengths and the vector angles of the segments, and creates the segment information 612 (Operation S1301). The information processing device 100 identifies a combination in which a difference between the vector angles is equal to the difference of the vector angles of the extraction condition table 613, from among vector angles in the segment information 612 (Operation S1302).

The information processing device 100 determines whether "length of the combination$\geq \alpha$" is satisfied (Operation S1303). When "length of the combination$\geq \alpha$" is not satisfied (Operation S1303: No), the processing returns to Operation S1302. When "length of the combination$\geq \alpha$" is satisfied (Operation S1303: Yes), the information processing device 100 determines whether "perpendicular line length of the combination$\geq \alpha$" is satisfied (Operation S1304).

When "perpendicular line length of the comnbination$\leq \beta$" is not satisfied (Operation S1304: No), the processing returns to Operation S1302. When "perpendicular line length of the comnbination$\leq \beta$" is satisfied (Operation S1304: Yes), the information processing device 100 registers the combination to the table (Operation S1305). The information processing device 100 determines whether all segments have been checked (Operation S1306). When the information processing device 100 determines that not all of the segments have been checked (Operation S1306: No), the processing returns to Operation S1302.

When the information processing device 100 determines that all of the segments have been checked (Operation S1306: Yes), the information processing device 100 identifies a combination group in which the number of successive combinations is larger than that of in the extraction condition table 613 (Operation S1307). The information processing device 100 registers the identified combination group to the repeat symbol table (Operation S1308), and a series of the pieces of processing ends.

From among combinations each of which includes parallel wiring parts that satisfy the condition of the repeat wiring shape of the length, the angle, and the distance, a combination group having the certain number of succession combinations is identified as the repeat wiring part of the differential wiring, and the identified repeat wiring part is symbolized and displayed. Therefore, topology of the repeat wiring part of the differential wiring having a complicated shape may be visually obtained. When the verifier uses the topology, the electrical characteristic may be checked easily, and the efficiency of the verification may be achieved.

For example, when the certain wiring is differential wiring, the obtaining unit 601 obtains wiring part information 611 indicating a plurality of parallel wiring parts and a plurality of non-parallel wiring parts, in the differential wiring. Generation processing of the segment information 612 may not be executed by the segment information generation unit 602. The wiring part information 611 is, for example, information indicating the positions of the starting point and the ending point, for each of the plurality of parallel wiring parts and each of the plurality of non-parallel wiring parts. In order to display the topology as illustrated in FIG. 4, wiring parts in the differential wiring are classified into the plurality of parallel wiring parts and the plurality of non-parallel wiring parts.

The first identification unit 603 identifies the length of the parallel wiring part and an angle of the parallel wiring part for a certain vector in the space indicated by the layout information 101 based on the orientation of the parallel wiring parts from the starting point to the ending point, for each of the plurality of parallel wiring parts indicated by the wiring part information 611. The certain vector may be the same as the above-description, and may be for example, the x axis.

Figures 14A, 14B:
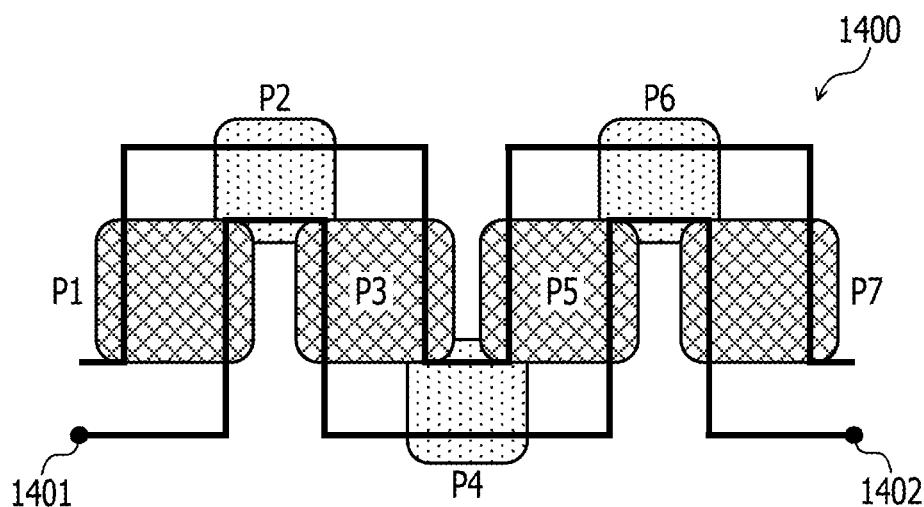
FIGS. 14A and 14B illustrate an example of a topology.

FIGS. 14A and 14B illustrate an example of a topology. As illustrated in FIG. 14A, in differential wiring 1400, parallel wiring parts from the starting point 1401 to the ending point 1402 corresponds to P1 to P7. Segment information 612 illustrated in FIG. 14B includes fields of the parallel wiring part name, the length, and the vector angle. When information is set to each of the fields, the information is identified as a record 1411.

Identification information used to identify a parallel wiring part is set to the field of the parallel wiring part name. The length of the parallel wiring part is set to the field of the length. A vector angle of the parallel wiring part is set to the field of the vector angle. In a record 1411-1, "P1" is set to the field of the parallel wiring part name, and "10 [mm]" is set to the field of the length, and "90 degree" is set to the field of the vector angle.

The second identification unit 604 identifies a combination in which each length of each of the parallel wiring parts is a certain length or more, a furthest distance of a perpendicular line between the parallel wiring parts is a certain distance or less, and angles of the parallel wiring part are different by a certain angle. The second identification unit 604 identifies a combination that satisfies each of the extraction conditions, for example, from among available combinations of two parallel wiring parts from the plurality of parallel wiring parts. For the certain length, the certain distance, and the certain angle, tables substantially the same as or similar to the extraction condition tables 901 to 903 for the single-ended wiring as illustrated in FIG. 9 may be used, and the verifier may set tables separately.

For example, the extraction condition table 901 illustrated in FIG. 9A may be used. For example, because a difference between the vector angles of the P1 and the P3 is 180 degree, the second identification unit 604 sets a combination of the P1 and the P3 as a candidate combination. For example, both of the lengths of the P1 and the P3 of the combination are 10 [mm], and the second identification unit 604 determines the combination of the P1 and the P3 as the candidate combination having the lengths which are the certain length more, for example, 5 [mm] or more. For example, the furthest distance of a perpendicular line between the P1 and the P3 is 5 [mm], and the second identification unit 604 determines the combination of the P1 and the P3 as the candidate combination having the furthest distance of the perpendicular line which is the certain distance or less, for example, 5 [mm] or less. The furthest distance of the perpendicular line between the P1 and the P3 may be a distance between outside wiring of the P1 and outside wiring of the P3. The combination of the P1 and the P3 satisfies the three conditions, so that the combination is identified as the candidate combination. Similar to the combination of the P1 and the P3, a combination of the P3 and the P5, and a combination of the P5 and the P7 are also identified as the candidate combination.

The second identification unit 604 identifies a combination group having the certain number of successive combinations including substantially the same parallel wiring part, from the identified combinations. For the certain number, tables substantially the same as or similar to the condition tables for the single-ended wiring as illustrated in FIG. 9 may be used, or the verifier may set tables separately. Because the combination of the P1 and the P3, the combination of the P3 and the P5, and the combination of the P5 and the P7 include three, which is the certain number, successive combinations, the combinations may be identified as a combination group.

When the target circuit is displayed using topology based on the layout information 101, the display unit 605 symbolizes and displays parallel wiring parts at both ends of the identified combination group, and parallel wiring parts between the parallel wiring parts at both of the ends of the identified combination group, from among the plurality of parallel wiring parts. The display unit 605 symbolizes the P1 to the P7 as the repeat wiring part.

Figure 15A:
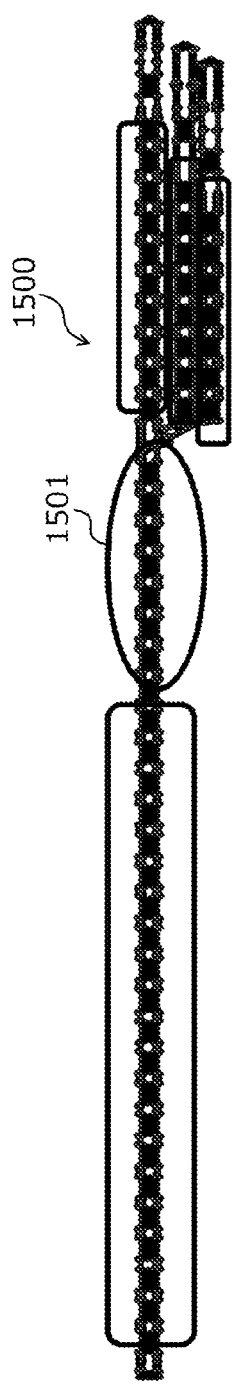
FIGS. 15A and 15B illustrate an example of a topology.
Figure 15B:
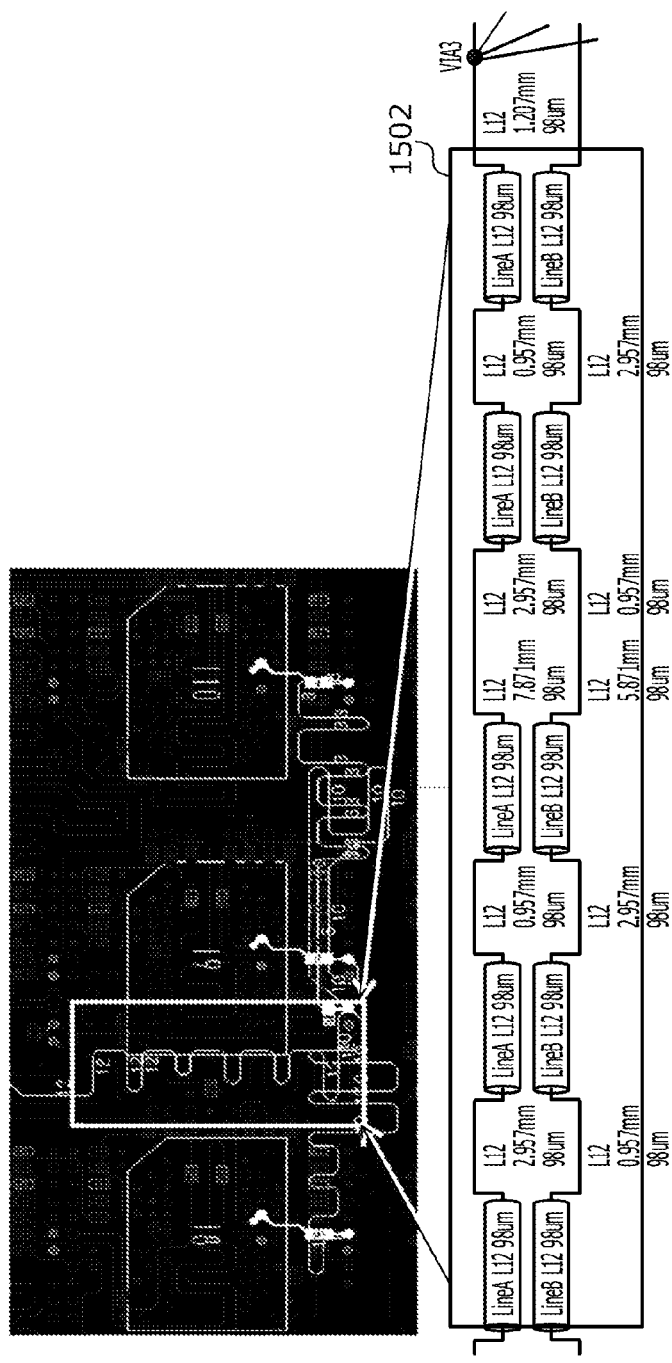

FIGS. 15A and 15B illustrate an example of a topology. In FIGS. 15A and 15B, topology examples of differential wiring are illustrated. In FIG. 15A, topology 1500 is illustrated. Topology 1502 corresponding to layout wiring of a portion 1501 enclosed by the circle illustrated in FIG. 15A is illustrated in FIG. 15B.

Figure 16:
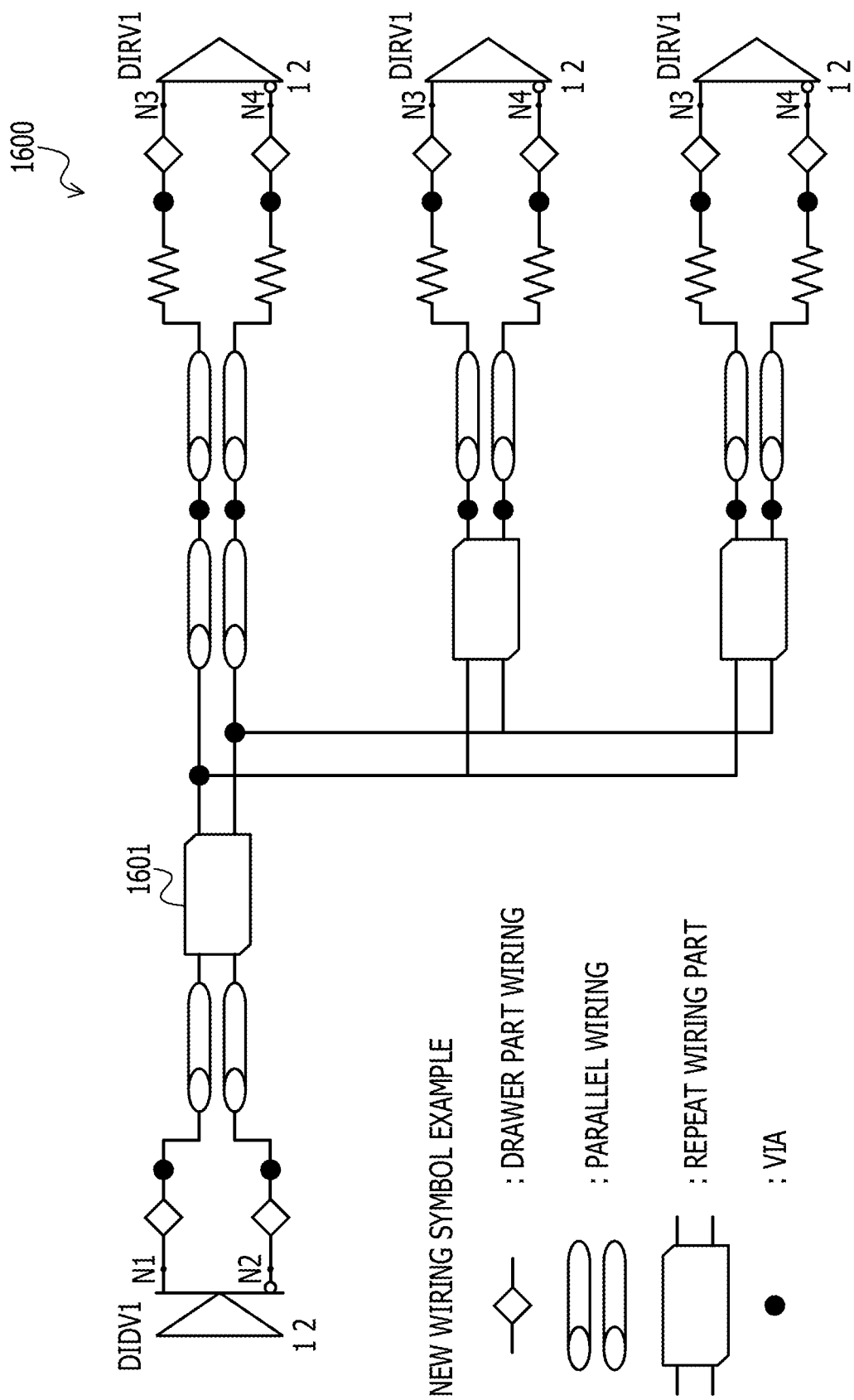
FIG. 16 illustrates an example of a symbolization of a repeat wiring part of a differential wiring.

FIG. 16 illustrates an example of a symbolization of a repeat wiring part of a differential wiring. A symbol 1601 obtained by symbolizing the repeat wiring part of the differential wiring is added to topology 1600. The content set to the symbol 1601 may be similar to the content illustrated in FIG. 11.

Figure 17:
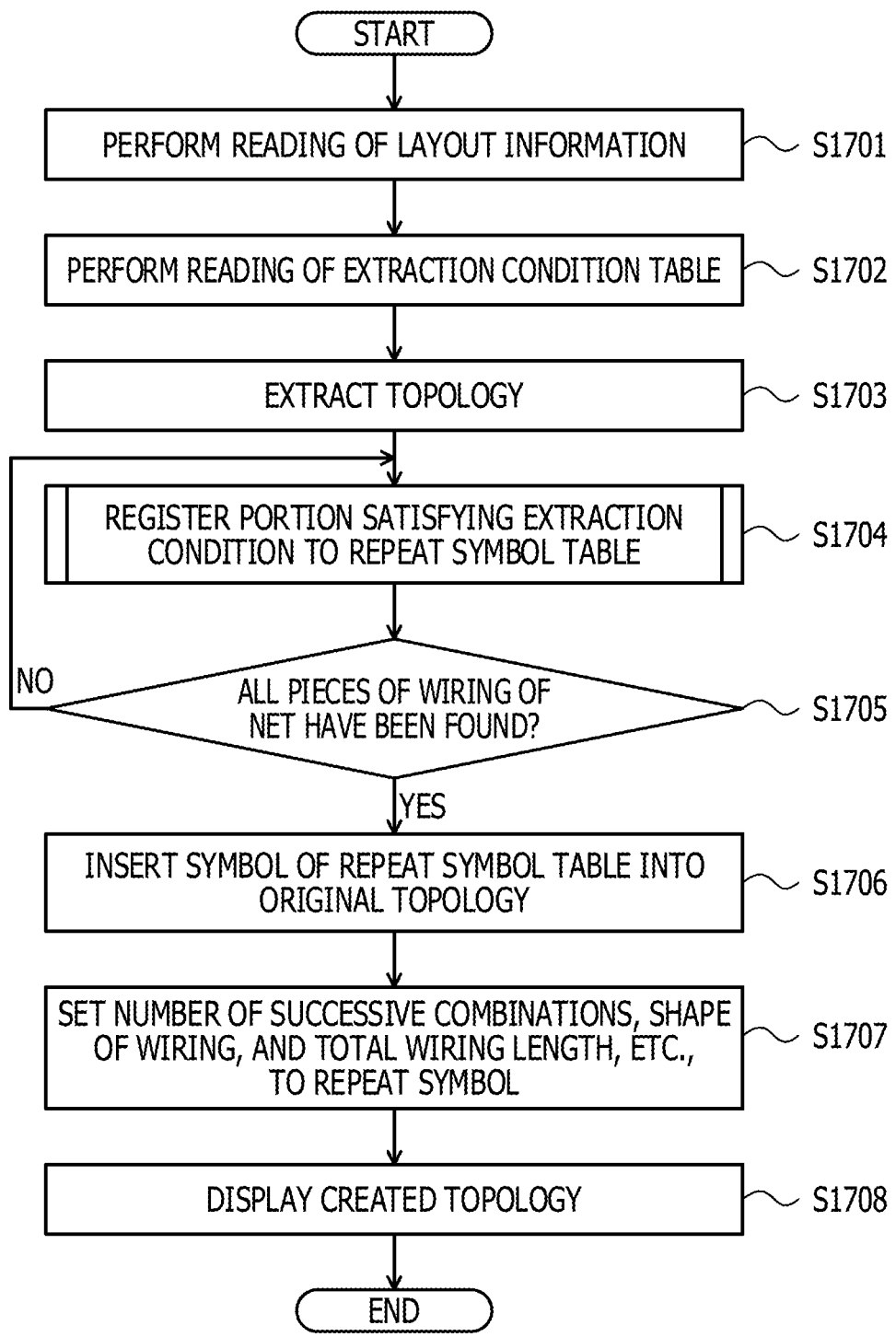
FIG. 17 illustrates an example of a topology display processing.

FIG. 17 illustrates an example of a topology display processing. The information processing device illustrated in FIG. 5 or 6 may execute the topology display processing illustrated in FIG. 17. The information processing device 100 performs reading of the layout information 101 (Operation S1701). The information processing device 100 performs reading of the extraction condition table (Operation S1702).

The information processing device 100 extracts the topology (Operation S1703). The information processing device 100 registers a portion that satisfies the extraction condition to the repeat symbol table (Operation S1704). The information processing device 100 determines whether all of the pieces of wiring of the net of the target circuit indicated by the layout information 101 have been searched (Operation S1705).

When the information processing device 100 determines that not all of the pieces of wiring have been searched (Operation S1705: No), the processing returns to Operation S1704. When the information processing device 100 determines that all of the pieces of wiring have been searched (Operation S1705: Yes), for example, the information processing device 100 inserts the symbol of the repeat symbol table into the topology illustrated in FIGS. 15A and 15B (Operation S1706).

The information processing device 100 sets the number of successive combinations, the shape of the wiring, and the total wiring length, to the repeat symbol (Operation S1707). The information processing device 100 displays the created topology (Operation S1708), and a series of the pieces of processing ends.

Figure 18:
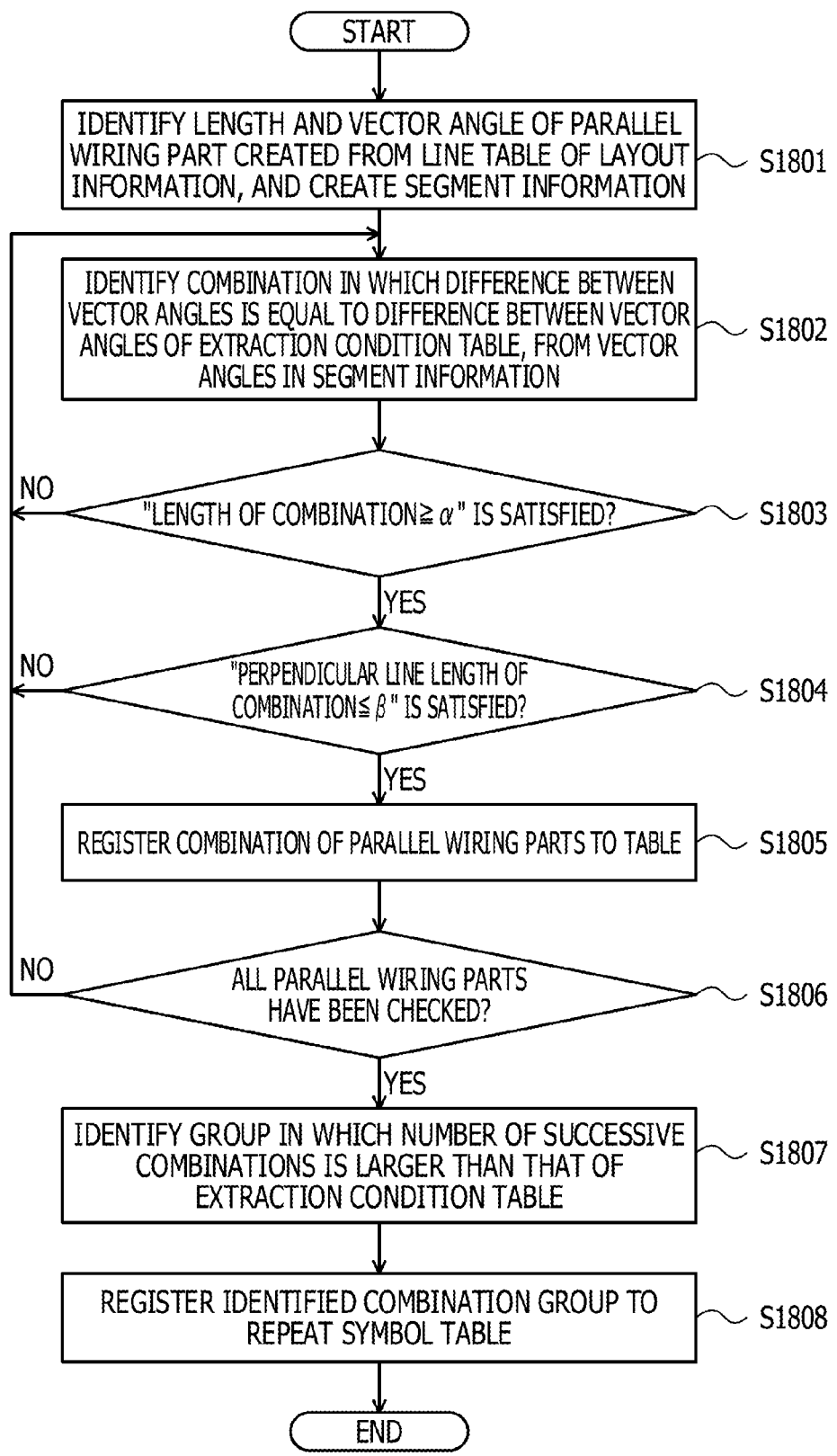
FIG. 18 illustrates an example of a registration processing.

FIG. 18 illustrates an example of a registration processing. The registration processing illustrated in FIG. 18 corresponds to the registration processing illustrated in FIG. 17 (Operation S1704). The information processing device 100 identifies the length and the vector angle of the parallel wiring part created from the line table 700 of the layout information 101, and creates the segment information 612 (Operation S1801). The information processing device 100 identifies, from the segment information 612, a combination in which a difference between the vector angles is equal to the difference between the vector angles of the extraction condition table (Operation S1802).

The information processing device 100 determines whether "length of the comnbination≥α" is satisfied (Operation S1803). Here, "α" is a certain length. When the information processing device 100 determines that "length of the combination≥α" is not satisfied (Operation S1803: No), the processing returns to Operation S1802. When the information processing device 100 determines that "length of the combination≥α" is satisfied (Operation S1803: Yes), the information processing device 100 determines whether "perpendicular line length of combination≤β" is satisfied (Operation S1804). Here, "β" is a certain distance. When the information processing device 100 determines that "perpendicular line length of combination≤β" is not satisfied (Operation S1804: No), the processing returns to Operation S1802. When the information processing device 100 determines that "perpendicular line length of combination≤β" is satisfied (Operation S1804: Yes), the information processing device 100 registers the combination of the parallel wiring parts to the table (Operation S1805).

The information processing device 100 determines whether all parallel wiring parts have been checked (Operation S1806). When the information processing device 100 determines that not all of the parallel wiring parts are checked (Operation S1806: No), the processing returns to Operation S1802.

When the information processing device 100 determines that all of the parallel wiring part have been checked (Operation S1806: Yes), the information processing device 100 identifies a combination group in which the number of successive combinations is larger than that of the extraction condition table (Operation S1807). The information processing device 100 registers the identified combination group to the repeat symbol table (Operation S1808), and a series of the pieces of processing ends.

The information processing device 100 identifies the portion of the combination group including the certain number of successive combinations, as the repeat wiring part, from among combinations each including the pieces of partial wiring that satisfy the condition of the repeat wiring shape of the lengths of the pieces of partial wiring, angles of the pieces of partial wiring, the distance between the pieces of partial wiring. The information processing device 100 symbolizes the identified repeat wiring part, and displays the added topology. Therefore, the topology of the repeat wiring part may be obtained visually. When the verifier uses the topology, the electrical characteristic may be easily checked, and the efficiency of the verification may be achieved.

The information processing device 100 divides certain wiring into a plurality of pieces of partial wiring at the position of at least one of a via included in the target circuit, a terminal of a component, a turnoff point on certain wiring, and a branch point on the certain wiring. Therefore, the shape of the repeat wiring part may be identified easily.

When the certain wiring is differential wiring, the information processing device 100 identifies the portion of a combination group including the certain number of successive combinations, as the repeat wiring part of the differential wiring, from among combinations each including the parallel wiring parts that satisfy the condition of the repeat wiring shape of the differential wiring of the lengths of the parallel wiring parts, the angles of the parallel wiring parts, and a distance between the parallel wiring parts. The information processing device 100 displays topology to which the symbolized identified repeat wiring part has been added. Therefore, the topology of the repeat wiring part of the differential wiring may be obtained visually. When the verifier uses the topology, the electrical characteristic may be checked easily, and the efficiency of the verification may be achieved.

In the information processing device 100, information on at least one of the length of the wiring, the shape of the wiring, the number of combinations included in the combination group is set to the symbolized wiring. Therefore, the state of the repeat wiring part may be visually obtained.

A wiring topology display method may be achieved by causing a computer such as a personal computer and a workstation to execute a wiring topology display program that has been prepared in advance. The wiring topology display program may be recorded to a computer-readable recording medium such as a magnetic disk, an optical disk, or a universal serial bus (USB) flash memory, and may be read from the recording medium and executed by the computer. The wiring topology display program may be distributed through the network 509 such as the Internet.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wiring topology display method, comprising:
    obtaining layout information indicating positions of components included in a target circuit and a position of wiring that couples the components;
    dividing, by a computer, first wiring included in the target circuit into first pieces of partial wiring, under a condition, based on the layout information, and generating partial wiring information indicating the first pieces of partial wiring;
    identifying, for each of the first pieces of partial wiring, a first length of the partial wiring and a first angle of the partial wiring for a vector of a space indicated by the layout information based on orientation of each of the first pieces of partial wiring;
    identifying, from among the first pieces of partial wiring, one or more combinations of second pieces of partial wiring based on the first length and the first angle, the second pieces of partial wiring having second lengths which are a certain length or more, second angles which are different by a certain angle, and a distance between the second pieces of partial wiring which is a certain distance or less;
    identifying, from among the one or more combinations, a group having the combination including pieces of identical partial wiring; and
    symbolizing third pieces of partial wiring at both ends of the group and fourth pieces of partial wiring between the third pieces of partial wiring.

2. The wiring topology method according to claim 1, wherein the pieces of identical partial wiring in the combination of the group are successive.

3. The wiring topology method according to claim 1, wherein
    the condition includes a division point.

4. The wiring topology method according to claim 3, wherein the division point is at least one position of a via, a terminal of the component, a turnoff point on the first wiring, and a branch point on the first wiring that are included in the target circuit.

5. The wiring topology method according to claim 1, wherein
    the first wiring is wiring coupling one component included in the components and the other component included in the components,
    a starting point of the first wiring is an output terminal of the one component, and
    an ending point of the first wiring is an input terminal of the other component.

6. The wiring topology method according to claim 1, further comprising:
    displaying symbolized third pieces of partial wiring and symbolized fourth pieces of partial wiring.

7. A wiring topology method, comprising:
    obtaining layout information indicating positions of components included in a target circuit and a position of wiring that couples the components;
    obtaining, by a computer, wiring part information indicating first parallel wiring parts and non-parallel wiring parts of a first wiring that is differential wiring included in the target circuit, based on the layout information;
    identifying, for each of the first parallel wiring parts, a first length of the parallel wiring part and an first angle of the parallel wiring part for a vector of a space indicated by the layout information based on orientation of each of the first parallel wiring parts;
    identifying, from among the first parallel wiring parts, one or more combinations of the second parallel wiring parts based on the first length and the first angle, the second parallel wiring parts having second lengths which are a certain length or more, second angles which are different by a certain angle, and a distance between the second parallel wiring parts which is a certain distance or less;
    identifying, from among the one or more combinations, a group having the combination including identical parallel wiring parts; and
    symbolizing third parallel wiring parts at both ends of the group and a fourth parallel wiring part and the non-parallel wiring part between the third parallel wiring parts.

8. The wiring topology method according to claim 7, wherein the identical partial wiring parts in the combination of the group are successive.

9. The wiring topology method according to claim 8, wherein
    information on at least one of the length, the shape, and the number of successive identical partial wiring parts is set to a symbolized wiring part.

10. The wiring topology method according to claim 7, further comprising:
    displaying symbolized third parallel wiring parts, a symbolized fourth parallel wiring part and a symbolized non-parallel wiring part.

11. An information processing device comprising:
    a processor configured to execute a wiring display program; and
    a memory configured to store the wiring display program,
    wherein the processor, based on the wiring display program, configured to:
    obtain layout information indicating positions of components included in a target circuit and a position of wiring that couples the components; and
    execute first processing for first wiring that is not differential wiring and is included in the target circuit,
    wherein, in the first processing, the processor configured to:
    divide the first wiring into first pieces of partial wiring, under a condition, based on the layout information, and generating partial wiring information indicating the first pieces of partial wiring;
    identify, for each of the first pieces of partial wiring, a first length of the partial wiring and a first angle of the partial wiring for a vector of a space indicated by the layout information based on orientation of each of the first pieces of partial wiring;
    identify, from among the first pieces of partial wiring, one or more combinations of second pieces of partial wiring based on the first length and the first angle, the second pieces of partial wiring having second lengths which are a certain length or more, second angles which are different by a certain angle, and a distance between the second pieces of partial wiring which is a certain distance or less;

identify, from among the one or more combinations, a group having the combination including pieces of identical partial wiring; and symbolize third pieces of partial wiring at both ends of the group and fourth pieces of partial wiring between the third pieces of partial wiring.

12. The information processing device according to claim 11, wherein the pieces of identical partial wiring in the combination of the group are successive.

13. The information processing device according to claim 11, wherein
the condition includes a division point.

14. The information processing device according to claim 13, wherein the division point is at least one position of a via, a terminal of the component, a turnoff point on the first wiring, and a branch point on the first wiring that are included in the target circuit.

15. The information processing device according to claim 11, wherein
the first wiring is wiring coupling one component included in the components and the other component included in the components,
a starting point of the first wiring is an output terminal of the one component, and
an ending point of the first wiring is an input terminal of the other component.

16. The information processing device according to claim 11, wherein
the processor executes second processing for second wiring that is differential wiring and is included in the target circuit, and
wherein, in the second processing, the processor configured to:

obtaining wiring part information indicating first parallel wiring parts and non-parallel wiring parts of the second wiring, based on the layout information;

identify, for each of the first parallel wiring parts, a first length of the parallel wiring part and an first angle of the parallel wiring part for a vector of a space indicated by the layout information based on orientation of each of the first parallel wiring parts;

identify, from among the first parallel wiring parts, one or more combinations of the second parallel wiring parts based on the first length and the first angle, the second parallel wiring parts having second lengths which are a certain length or more, second angles which are different by a certain angle, and a distance between the second parallel wiring parts which is a certain distance or less;

identify, from among the one or more combinations, a group having the combination including identical parallel wiring parts; and symbolize third parallel wiring parts at both ends of the group and a fourth parallel wiring part and the non-parallel wiring part between the third parallel wiring parts.

17. The information processing device according to claim 16, wherein the identical partial wiring parts in the combination of the group are successive.

18. The information processing device according to claim 17, wherein
information on at least one of the length, the shape, and the number of successive identical partial wiring parts is set to a symbolized wiring part.

* * * * *